United States Patent [19]

Ohba et al.

[11] Patent Number: 5,066,612

[45] Date of Patent: Nov. 19, 1991

[54] METHOD OF FORMING WIRING OF A SEMICONDUCTOR DEVICE

[75] Inventors: Takayuki Ohba, Yokohama; Shinji Miyagaki, Tokyo; Tatsushi Hara, Inagi; Kenji Morishita, Yokohama; Seiichi Suzuki, Kawasaki; Seigen Ri, Yokohama, all of Japan

[73] Assignee: Fujitsu Limited, Kawasaki, Japan

[21] Appl. No.: 637,152

[22] Filed: Jan. 3, 1991

[30] Foreign Application Priority Data

Jan. 5, 1990 [JP] Japan .................................. 2-277
Feb. 20, 1990 [JP] Japan .................................. 2-38826

[51] Int. Cl.$^5$ ...................... H01L 21/44; H01L 21/48
[52] U.S. Cl. .................................. 437/192; 437/195; 437/978; 437/200
[58] Field of Search ............... 437/192, 195, 978, 194, 437/200

[56] References Cited

U.S. PATENT DOCUMENTS

| | | | |
|---|---|---|---|
| 4,948,755 | 8/1990 | Mo | 437/200 |
| 4,963,511 | 10/1990 | Smith | 437/192 |
| 4,987,099 | 1/1991 | Flanner | 437/192 |

FOREIGN PATENT DOCUMENTS 12551 1/1989 Japan .
82653 3/1989 Japan .
192137 8/1989 Japan .

Primary Examiner—Brian E. Hearn
Assistant Examiner—Trung Dang
Attorney, Agent, or Firm—Staas & Halsey

[57] ABSTRACT

In the course of a production of a semiconductor device with a multilayer insulating layer, when a contact hole is opened in the multilayer insulating layer, an insulating layer activating a metal selective vapor-growth appears at the side wall of the contact hole. A thin metal (e.g., tungsten) layer is selectively deposited in the contact hole. In another case, another metal layer appears within the contact hole. An insulating film preventing a metal selective vapor-growth is deposited over the whole surface of the side wall of the contact hole, the metal layer and a top surface of the multilayer insulating layer, and is anisotropically etched to leave a portion of the film lying on the side wall only as a side wall insulating film. The contact hole is completely filled with another metal (tungsten) by a selective vapor-growth method, to flatten an exposed surface, and then a conductor (e.g., aluminum) line layer is formed on the metal layer in the contact hole and the multilayer insulating layer, to thereby complete the wiring structure of the semiconductor device.

16 Claims, 7 Drawing Sheets

METHOD OF FORMING WIRING OF A SEMICONDUCTOR DEVICE

BACKGROUND OF THE INVENTION

1. Field of the Invention

The present invention relates to a method of producing a semiconductor device, such as IC and LSI, and more particularly, to a method of forming the wiring of the semiconductor device, including a step of filling contact holes formed in a multilayer insulating layer with a metal selectively vapor-grown.

2. Description of the Related Art

During the production of a semiconductor device, to prevent the occurrence of step coverage problems (breakdown and thinning of a conductor line at a step) and to provide a flat surface level, a contact hole only is filled with a metal (e.g., a metal is selectively grown (deposited) within the contact hole).

A formation of the wiring of a semiconductor, using a metal selective growth process, is carried out, for example, as described below, with reference to FIGS. 1A and 1B.

As shown in FIG. 1A, a multilayer (quadruple-layer) insulating layer 2 is formed on a semiconductor substrate 1 of silicon (Si) by a conventional process. For example, the silicon substrate 1 is thermally oxidized to form a first insulating layer 2a of $SiO_2$ on the surface thereof, and a second insulating layer 2b is formed on the layer 2a by depositing PSG (phosphosilicate glass) by a CVD (chemical vapor deposition) process. An SOG (spin on glass) is coated over the layer 2b to form a third insulating layer 2c, and then PSG is deposited on the layer 2c by a CVD process to form a fourth insulating layer 2d.

Since the production of a semiconductor device involves a repetition of the layer formation step and selective etching step, the surface of the device becomes uneven. Accordingly, a flattening technique, such as a coating with SOG is used, but since SOG generates undesirable $H_2O$ gas during a heat-treatment (e.g., a heating of the substrate for depositing a CVD layer) and during usage of the device, the SOG coating is covered with an insulating layer of PSG and the like.

Next, a resist (polymeric material) is deposited on the fourth insulating layer 2d to form a resist layer, and this layer is then exposed and developed to form a resist mask (not shown). When the resist mask serves as a mask against an etchant, the insulating layers 2d, 2c, 2b and 2a are selectively etched by a RIE (reactive ion etching) method to open a contact hole 3 in the multilayer insulating layer 2, which hole 3 exposes a contact region of the substrate 1.

After removal of the resist mask, as shown in FIG. 1B, tungsten (W) is deposited (grown) within the contact hole 3 by a selective vapor-growth method, to form a metal layer (plug) 4. The metal layer 4 comes into contact with the substrate 1 and fills the contact hole 3 to reduce the height of a step at the hole edge and thereby form a smooth (flat) surface. Then, a predetermined conductor line layer (e.g., an aluminum line) 5 is formed on the metal layer 4 and the fourth insulating layer 2d, so that the line layer 5 is brought into electrical contact with the substrate 1 through the metal layer 4.

In addition to tungsten, the selectively vapor-growable metal can include aluminum (Al), copper (Cu), tantalum (Ta), and molybdenum (Mo), and a silicide of these metals.

Nevertheless, during the deposition of tungsten within the contact hole 3 only, to form the metal layer 4 by a metal selective vapor-growth method in the above-mentioned conventional process of forming the wiring of a semiconductor device, when the SOG insulating layer 2c of an insulating layer activating (promoting) a metal selective vapor-growth is exposed at the inside wall of the contact hole 3, the tungsten is abnormally deposited on a side wall portion of the SOG insulating layer 2c, and thus a growth of a tungsten portion 6 occurs as shown in FIG. 2. Therefore, in the worst case, the abnormally grown tungsten portion 6 blocks the contact hole 3 at the upper portion thereof, and accordingly a growing gas can not enter the contact hole 3 and the growing (depositing) of the metal layer 4 cannot proceed, with the result that a break in the wiring occurs. In other cases, the contact hole 3 is not completely filled with the metal layer 4, and thus a resistance of the metal layer 4 is increased.

SUMMARY OF THE INVENTION

An object of the present invention is to provide a method of forming wiring by completely filling a contact hole with a selectively vapor-grown metal, even though a multilayer insulating layer is provided with the contact hole having a side wall portion of an insulating layer which will activate the metal selective vapor-growth.

Another object of the present invention is to provide a method of producing a semiconductor device with fewer step-coverage problems.

The above-mentioned and other objects of the present invention are attained by providing a method of forming the wiring of a semiconductor device, comprising the following steps (a) to (f):

(a) forming a multilayer insulating layer comprising at least an insulating layer activating (promoting) a metal selective vapor-growth and a top insulating layer preventing (unpromoting) a metal selective-growth, on a semiconductor substrate;

(b) forming a contact-hole reaching the semiconductor substrate by selectively etching the multilayer insulating layer;

(c) growing a first metal layer having a thickness such that a surface of the layer lower than the level of the insulating layer preventing a metal selective vapor-growth in the contact-hole by a selective vapor-growing method;

(d) forming an insulator side film on the side wall of the contact-hole by depositing an insulator film preventing a metal selective vapor-growth over a whole surface of the inside surface of the contact-hole and the top insulating layer and by anisotropically etching the film to expose the surface of the first metal layer;

(e) filling the contact-hole with a second metal layer by depositing the second metal layer on the first metal layer and within the contact-hole by a selective vapor-growing method; and (f) forming a conductor line layer on the second metal layer and the top insulating layer.

During the anisotropic etching, the first metal layer serves as a stopper against an etching effect, to thereby protect the semiconductor substrate. It is possible to form the first metal layer by a process different from the above-mentioned process, and in this case, a second method of forming the wiring of a semiconductor device comprises the following steps (g) to (n):

(g) forming a first insulating layer on a semiconductor substrate;

(h) forming a first contact-hole by selectively etching the first insulating layer to expose the semiconductor substrate;

(i) forming a first metal layer to fill the first contact-hole;

(j) forming a multilayer insulating layer comprising at least an insulating layer activating a metal selective vapor-growth and a top insulating layer preventing a metal selective-growth on the first insulating layer and first metal layer;

(k) forming a second contact-hole reaching the first metal layer by selectively etching the multilayer insulating layer;

(l) forming an insulator side film on the side wall of the contact-hole by depositing an insulator film preventing a metal selective vapor-growth over a whole surface of the inside surface of the second contact-hole and the top insulating layer and by anisotropically etching the film to expose the surface of the first metal layer;

(m) filling the contact-hole with a second metal layer by depositing the second metal layer on the first metal layer and within the second contact-hole by a selective vapor-growing method; and (n) forming a conductor line layer on the second metal layer and the top insulating layer.

Furthermore, the present invention can be applied to a multilayer wiring structure of a semiconductor, and in such a case, a lower (first) conductor line layer (corresponding to the semiconductor substrate) is formed, a metal layer coming in contact with the lower conductor line is formed within a contact hole by a selective vapor-growth method, and an upper (second) conductor line layer is formed on the metal layer.

A third method of forming the wiring of a semi-conductor device comprises following steps (o) to (s):

(o) forming a multilayer insulating layer comprising at least an insulating layer activating a metal selective vapor-growth and a top insulating layer preventing a metal selective-growth over a whole exposed surface of an insulating film on a semiconductor substrate and a first conductor line layer formed on the insulating film;

(p) forming a contact-hole reaching the first conductor line by selectively etching the multilayer insulating layer;

(q) forming an insulator side film on the side wall of the contact-hole by depositing an insulator film preventing a metal selective vapor-growth over a whole surface of the inside surface of the contact-hole and the top insulating layer and by anisotropically etching the insulator film to expose the surface of the first conductor line layer;

(r) filling the contact-hole with a metal layer by depositing the metal layer on the first conductor line layer and within the contact-hole by a selective vapor-growing method; and (s) forming a second conductor line layer on the metal layer and the top insulating layer.

A material of the insulating layer activating a metal selective vapor-growth includes SOG, polyimide and the like, and a material of the top insulating layer and the insulating film preventing a metal selective-growth includes PSG, BSG, BPSG and the like. $SiO_2$ and SiN can activate or prevent a metal selective vapor-growth, depending on a moisture content and surface-condition thereof.

The selectively vapor-growable metal includes tungsten, aluminum, copper, tantalum, molybdenum, and silicides of these metals, but a selective vapor-growth of tungsten is particularly preferable.

The material of the first conductor line layer in the multilayer wiring structure includes aluminum, tungsten, titanium, metal silicide, titanium nitride, tantalum, molybdenum, zirconium and gold.

Although a multilayer insulating layer is formed on a semiconductor substrate or a lower conductor line layer and then an insulating layer activating (promoting) a metal selective vapor-growth is deposited on a side wall of a contact hole opened in the multilayer insulating layer, the slide wall is covered with a side wall insulating film preventing (not-promoting) a metal selective-growth, with the result that the contact hole can be filled with a metal by a metal selective vapor-growth method without the occurrence of an abnormal metal growth (deposition).

BRIEF DESCRIPTION OF THE DRAWINGS

The present invention will be more apparent from the description of the preferred embodiments set forth below, with reference to the accompanying drawings, in which.

DESCRIPTION OF THE PREFERRED EMBODIMENTS

Example 1

Figure 1A:
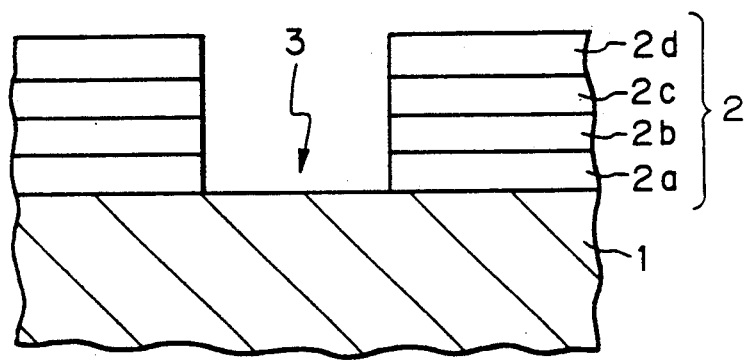
FIGS. 1A and 1B are schematic sectional views of a semiconductor device during a conventional production process thereof.
Figure 1B:
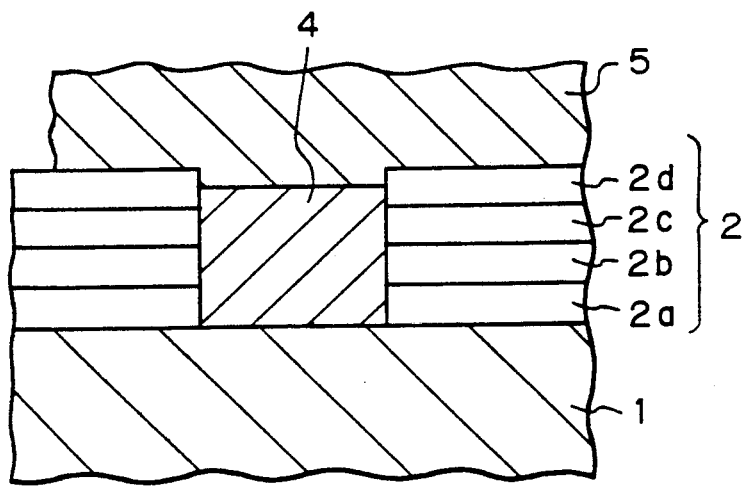
Figure 2:
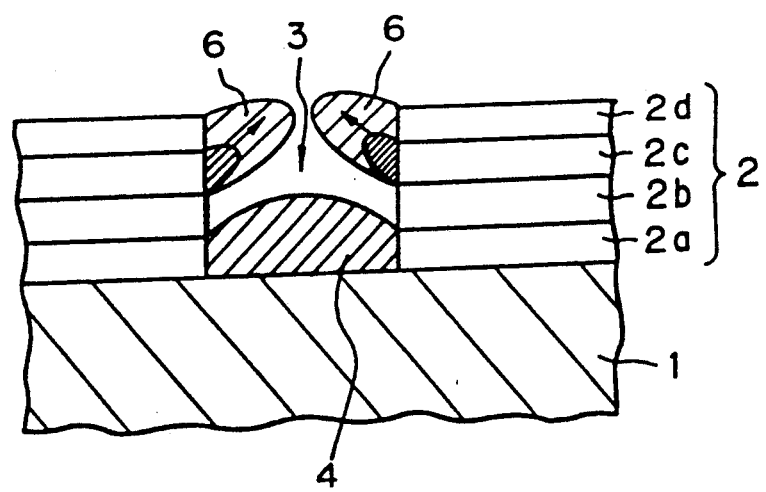
FIG. 2 is a schematic sectional view of a semiconductor device having an abnormally grown metal portion.
Figure 3A:
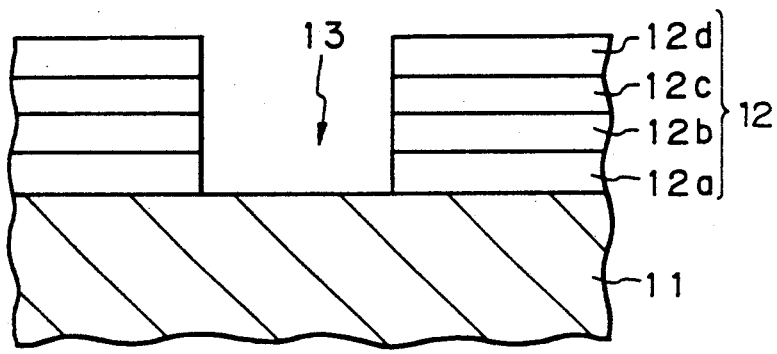
FIGS. 3A to 3F are schematic sectional views of a semiconductor device during the production process thereof in accordance with a first embodiment of the present invention.
Figure 3B:
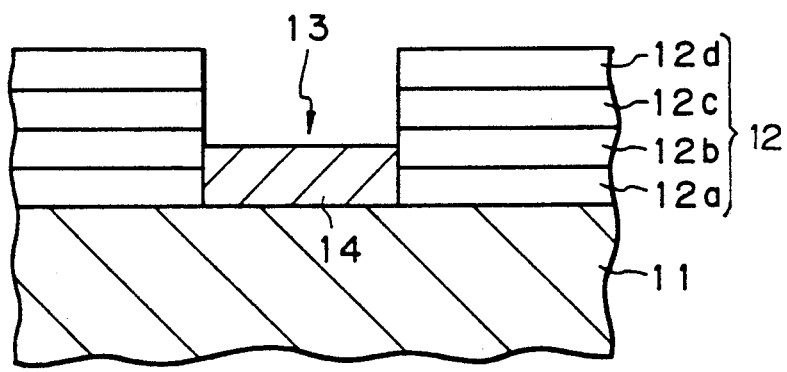
Figure 3C:
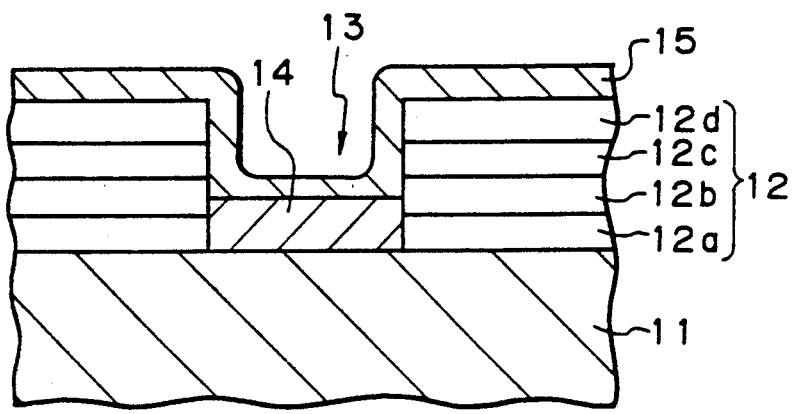
Figure 3D:
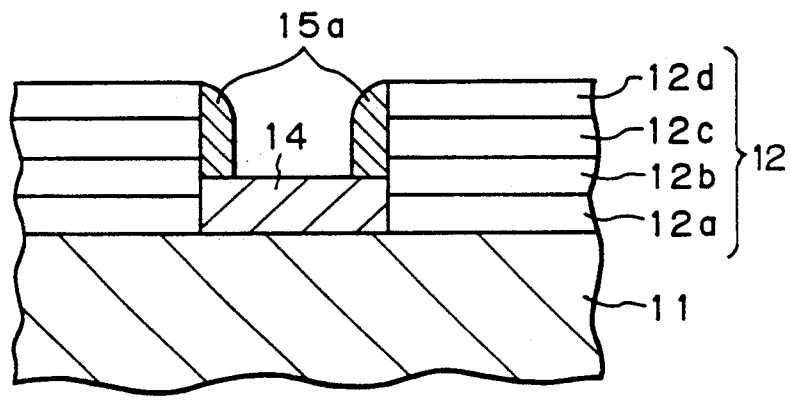
Figure 3E:
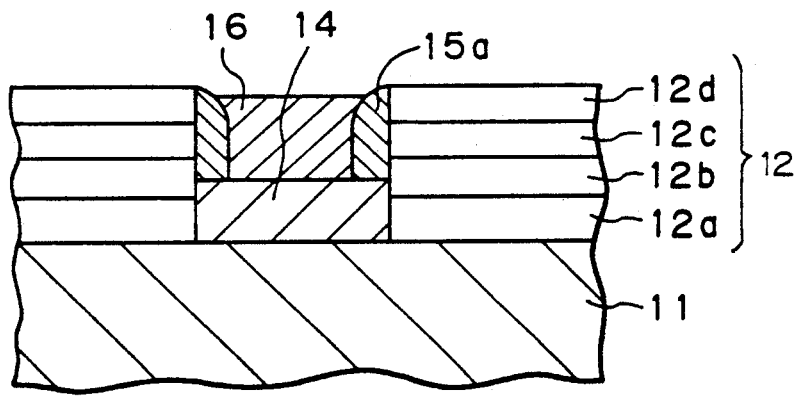
Figure 3F:
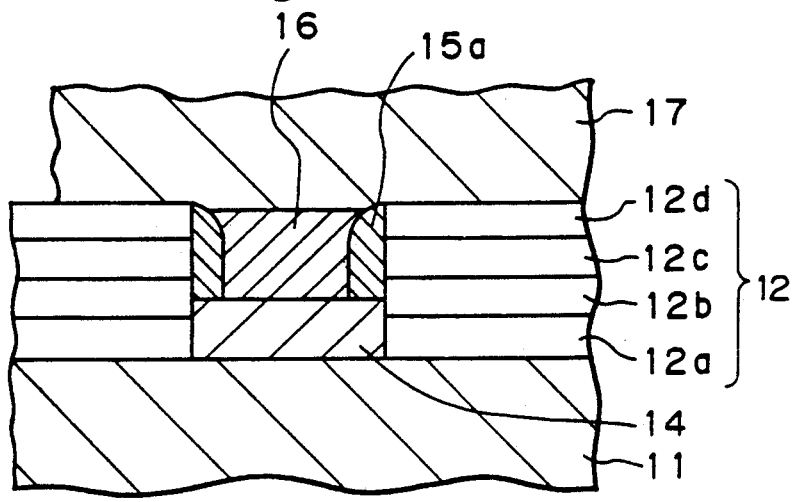

Referring to FIG. 3F, a semiconductor device is provided with wiring formed in accordance with a first embodiment of the present invention. In this case, a multilayer insulating layer 12 formed on a semiconductor (e.g., silicon) substrate 11 consists of four layers, i.e., a $SiO_2$ insulating layer 12a, a PSG insulating layer 12b, an SOG insulating layer 12c, and a top PSG insulating layer 12d. The multilayer insulating layer 12 has a contact hole which is filled with a thin first tungsten layer 14, a PSG insulating film 15a deposited on the side wall of the contact hole (a side wall insulating film preventing a metal selective-growth), and a second tungsten layer 16. A predetermined conductor line layer (an aluminum patterned layer) 17 is formed on the second tungsten layer 16 and the multilayer insulating layer 12, and constitutes the wiring.

The wiring of the semiconductor device is formed in the following manner.

First, as shown in FIG. 3A, the silicon substrate 11 is thermally oxidized to form the first insulating layer 12a, made of SiO₂ and having a thickness of 100 nm, on the substrate 11, PSG is deposited on the first insulating layer 12a by a CVD method, to form the second insulating layer 12b having a thickness of 200 nm, SOG is deposited on the second insulating layer 12b by a spin coating method to form the third insulating layer 12c having a thickness of 400 nm, and finally, PSG is deposited on the third insulating layer 12c by a CVD method to form the fourth insulating layer 12d having a thickness of 200 nm, to thereby complete the multilayer insulating layer 12 having a total thickness of 900 nm. Thereafter, a resist is deposited on the fourth insulating layer 12d, and exposed and developed to form a resist mask (not show). Then, utilizing this resist mask, the insulating layers 12d, 12c, 12b, and 12a are selectively etched by, e.g., an RIE method to form the contact hole 13 in the multilayer insulating layer 12, which contact hole 13 is exposes a contact region of the substrate 11.

After removal of the resist mask, as shown in FIG. 3B, tungsten (W) is deposited (grown) within the contact hole 13 by a selective vapor-growth method, to form the first tungsten (metal) layer 14 having a thickness of 200 nm but not reaching the third SOG insulating layer 12c. In this case, the tungsten layer 14 is grown to a certain level within the second PSG insulating layer 12b such that the sides of the third and fourth insulating layers 12c and 12d and a portion of a side of the second insulating layer 12b are exposed in the contact hole 13. The tungsten layer 14 is formed e g., under the following selective vapor-growth conditions.

| Vapor-growing gas: | WF₆ gas | 10 sccm |
|---|---|---|
|  | SiH₄ gas | 5 sccm |
|  | H₂ gas | 1000 sccm |
| Growth temperature (heated substrate temperature): | 320° C. | |
| Vacuum pressure: | 0.1 Torr | |

A little tungsten may be deposited at the same time on the exposed surface of the SOG insulating layer 12c, and since the deposition thickness of the first tungsten layer 14 is made preferably thinner, the deposited tungsten on the SOG layer 12c does not cause a problem.

Next, as shown in FIG. 3C, PSG (i.e., an insulator preventing a metal selective vapor-growth) is deposited by a plasma CVD method over the whole surface of the first tungsten layer 14, the side wall of the contact hole 13 and the fourth PSG insulating layer 12d, to thereby form an insulating film 15 having a thickness of 50 nm.

As shown in FIG. 3D, the insulating film 15 is anisotropically etched by an RIE method to expose the surface of the first tungsten layer 14, with the result that a portion of the film 15 lying on the side wall of the contact hole 13 remains as a side wall insulating film 15a. The remaining film 15a covers the side surface of the multilayer insulating layer 12 including the exposed SOG insulating layer 12c. In the anisotropic etching step, the first tungsten layer 14 serves as an stopper against the RIE, and thus the semiconductor substrate 11 is not impaired thereby.

Then, as shown in FIG. 3E, tungsten is selectively deposited (grown) within the contact hole 13 with the side wall insulating film 15a by a selective vapor-growth method, to form the second tungsten (metal) layer 16 having a thickness sufficient to fill the contact hole completely (e.g., of 700 nm); i.e., the contact hole is completely filled with tungsten (metal) selectively grown (without an abnormal growth portion). The conditions for the selective vapor-growth of the second tungsten layer 16 are the same as those for the first tungsten layer 14, except that the growing (deposition) time is prolonged in accordance with the desired growth (deposition) thickness.

Accordingly, the contact hole 13 is filled with the first and second tungsten layers 14 and 16, to flatten an exposed surface thereof (to eliminate a step which may cause step-coverage problems, and finally, the predetermined conductor line layer (the aluminum patterned layer) 17 is formed on the second tungsten layer 16 and the fourth (top) PSG insulating layer 12d by a conventional method to thereby obtain the wiring structure shown in FIG. 3F.

In this case, the third insulating layer 12c activating a metal selective vapor-growth is made of SOG, and polyimide in addition to the SOG has vapor deposition nuclei at the surface thereof, with the result that metal (tungsten) is deposited at the nuclei and is grown from the nuclei. BSG and BPSG, in addition to PSG, can be used for the top insulating layer and the insulating film preventing a metal selective vapor-growth, because these materials contain less moisture than the SOG and polyimide in a usual step, and thus the surface of the materials is not oxidized by water, which will a generation of an activating species and a reaction with the vapor-growing gas. Furthermore, SiO₂ and SiN serve as a material activating or preventing a metal selective vapor-growth, depending on the moisture contained therein and the surface conditions thereof.

Example 2

Referring to FIGS. 4A to 4E, a wiring of a semiconductor device is formed in the following manner in accordance with a second embodiment of the present invention.

Figure 4A:
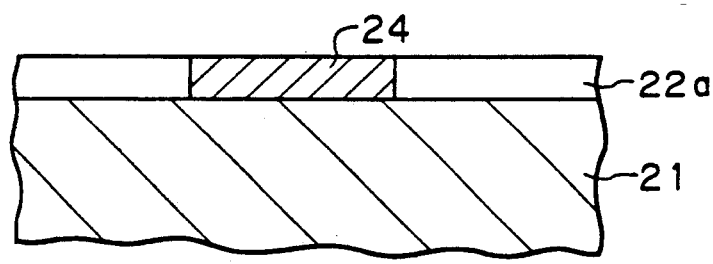
FIGS. 4A to 4E are schematic sectional views of a semiconductor device during the production process thereof in accordance with a second embodiment of the present invention.
Figure 4B:
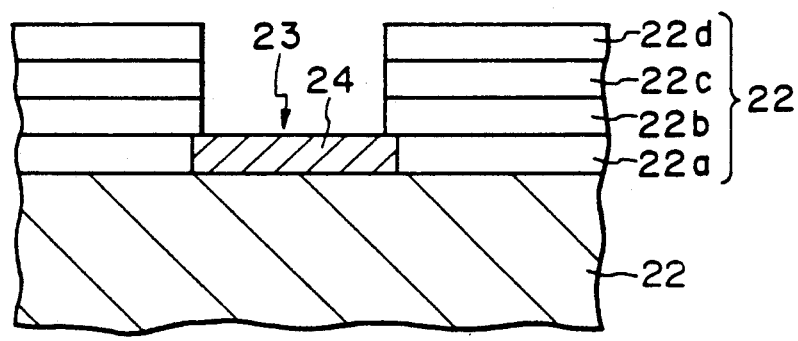

First, as shown in FIG. 4A, a silicon substrate 21 is thermally oxidized to form a first insulating layer 22a, made of SiO₂ and having a thickness of 200 nm, on the substrate 11. A resist mask (not shown) is formed on the first insulating layer 12a by a conventional lithography process (coating of resist, exposure and development), then an uncovered portion of the first insulating layer 22a is wet-etched to open a first contact hole by which a contact region of the substrate 21 is exposed. After removal of the resist mask, tungsten (W) is deposited (grown) within the first contact hole by a selective vapor-growth method, to form the first tungsten (metal) layer 24 having a thickness of 200 nm and substantially filling the first contact hole. The selective vapor-growth conditions of the layer 24 are almost the same as those of Example 1, e.g., as follows:

| Vapor-growing gas: | WF₈ gas | 10 sccm |
|---|---|---|
|  | SiH₄ gas | 5 sccm |
|  | H₂ gas | 1000 sccm |
| Growth temperature (heated substrate temperature): | 320° C. | |
| Vacuum pressure: | 0.1 Torr | |

Next, SiO₂ is deposited on the first insulating layer 22a and the first tungsten layer 24 by a plasma CVD method, to form a second insulating layer 22b having a thickness of 200 nm, then SOG is coated on the second insulating layer 22b by a spin coating method to form a third insulating layer 22c having a thickness of 400 nm, and then PSG is deposited on the third insulating layer 22c by a CVD method to form the fourth insulating layer 22d having a thickness of 200 nm, to thereby complete the multilayer insulating layer 22 having a total thickness of 1 μm. Thereafter, a resist is coated on the fourth insulating layer 22d, and exposed and developed to form another resist mask (not shown). Utilizing the resist mask, the insulating layers 22d, 22c and 22b are selectively etched by, e.g., an RIE method, to form a second contact hole 23 in the multilayer insulating layer 22, which hole exposes the first tungsten layer 24.

Figure 4C:
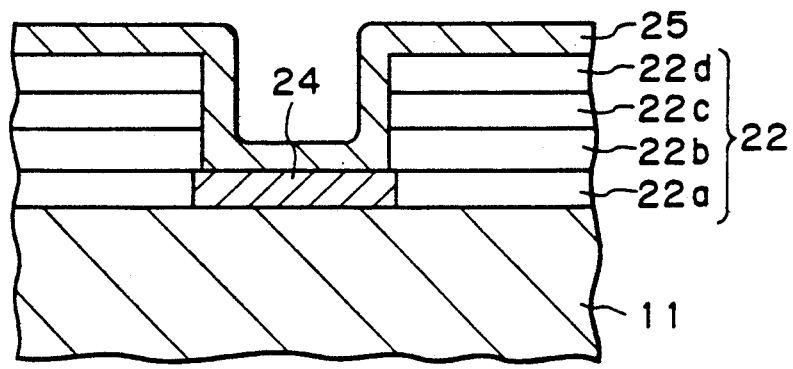

Next, as shown in FIG. 4C, PSG (i.e., an insulator preventing a metal selective vapor-growth) is deposited over the whole surface of the first tungsten layer 24, the side wall of the contact hole 23 and the fourth PSG insulating layer 22d by a plasma CVD method, to form an insulating film 25 having a thickness of 50 nm.

Figure 4D:
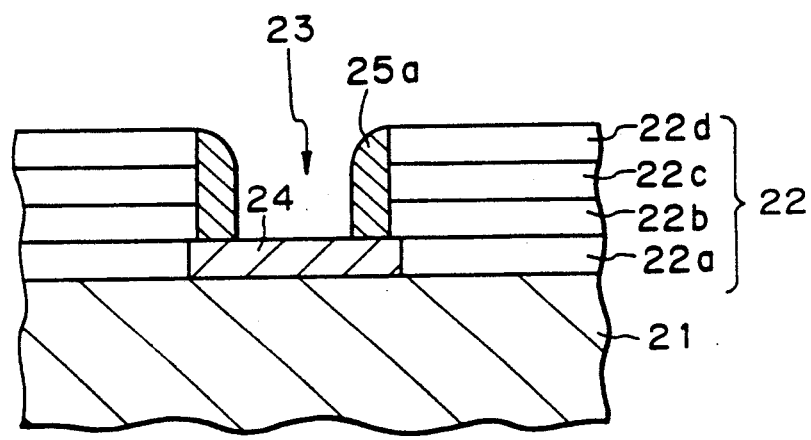

As shown in FIG. 4D, the insulating film 25 is anisotropically etched by an RIE method to expose the surface of the first tungsten layer 14, with the result that a portion of the film 25 lying on the side wall of the contact hole 23 remains as a side wall insulating film 25a. The remaining film 25a covers the side surface of the multilayer insulating layer 22 including the exposed SOG insulating layer 22c. In the anisotropic etching step, the first tungsten layer 24 serves as an stopper against the RIE, so that the semiconductor substrate 21 is not impaired thereby.

Figure 4E:
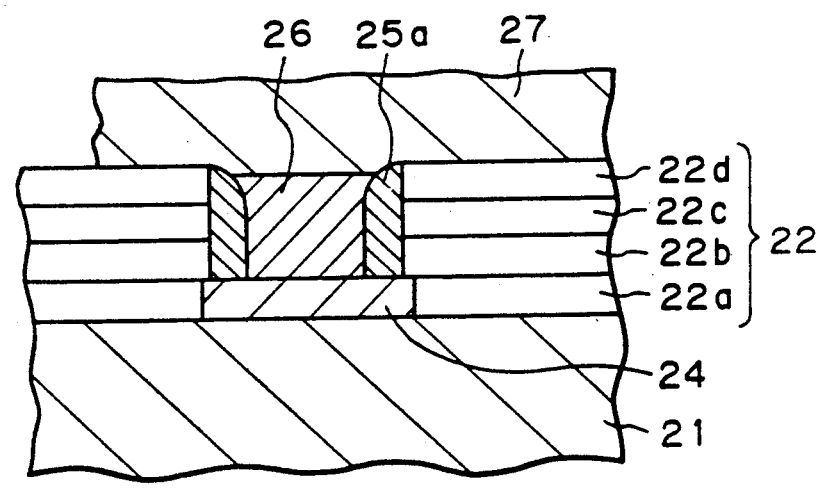

Then, as shown in FIG. 4E, tungsten is selectively deposited (grown) within the contact hole 23 with the side wall insulating film 25a by a selective vapor-growth method, to form the second tungsten (metal) layer 26 having a thickness sufficient to fill the contact hole completely (e.g., of 800 nm), and thus the contact hole is completely filled with tungsten (metal) which has been selectively grown (without an abnormal portion). The selective vapor-growth conditions of the second tungsten layer 16 are the same as those of the first tungsten layer 14, except that a growing (deposition) time is prolonged in accordance with a desired growth (deposition) thickness, i.e., until the exposed surface is flattened. Finally, the predetermined conductor line layer (the aluminum patterned layer) 27 is formed on the second tungsten layer 26 and the fourth (top) PSG insulating layer 22d by conventional steps, to obtain the wiring structure shown in FIG. 4E.

Example 3

Figure 5A:
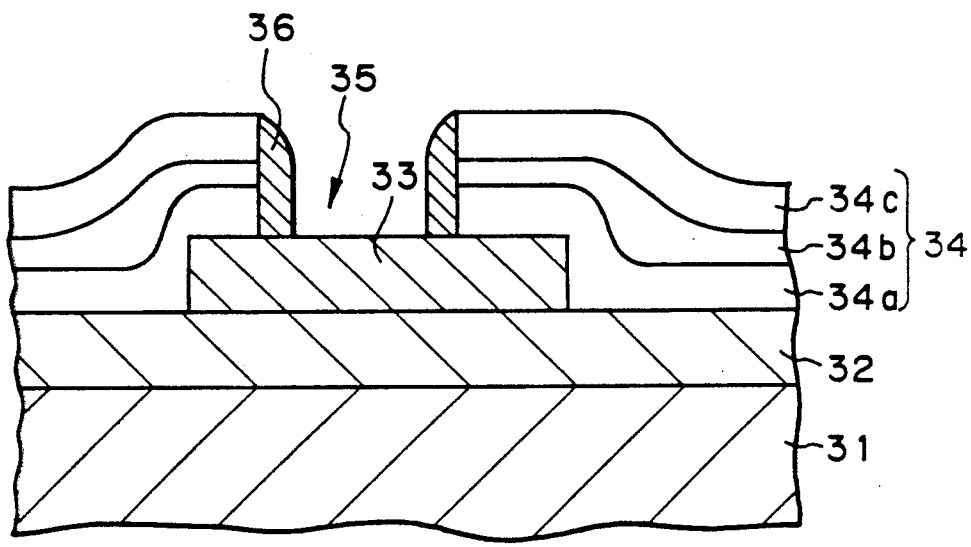
FIGS. 5A to 5B are schematic sectional views of a semiconductor device during the production process thereof in accordance with a third embodiment of the present invention.
Figure 5B:
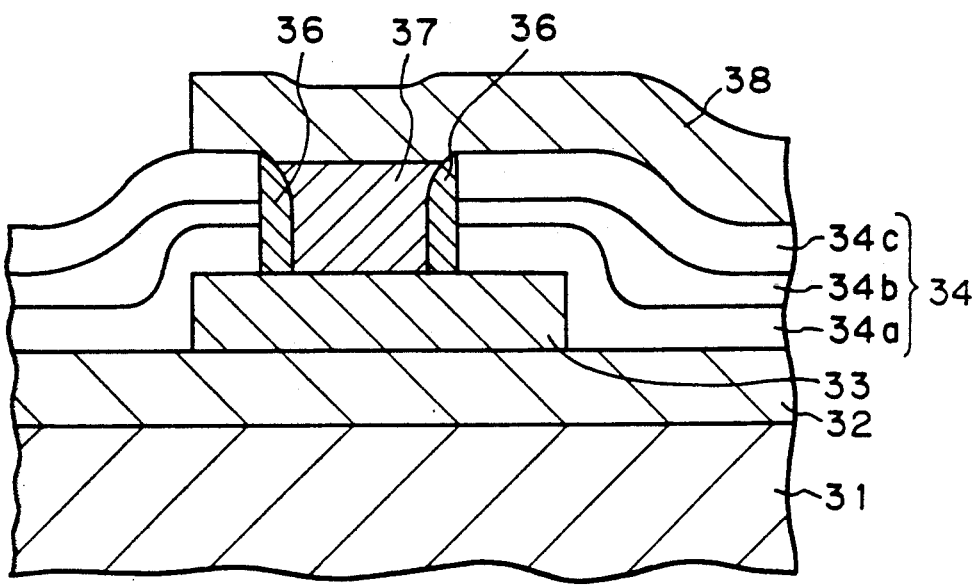

Referring to FIGS. 5A and 5B, a wiring of a semiconductor device is formed in the following manner in accordance with a third embodiment of the present invention.

First, as shown in FIG. 5A, a silicon substrate 31 is thermally oxidized by a conventional method to form a SiO2 insulating layer 32 having a thickness of 500 nm on the substrate 31. A lower (first) conductor line layer 33 having a predetermined pattern (e.g., an aluminum patterned layer) is formed on the layer 32. Then, PSG is deposited by a CVD method over the whole surface of the insulating layer 32 and the lower conductor line layer 33 to form a first insulating layer 34a having a thickness of 200 nm, SOG is coated on the first insulating layer 34a by a spin coating method to form the second insulating layer 34b having a thickness of 200 nm, and then PSG is deposited on the second insulating layer 34b by a CVD method to form a third insulating layer 34c having a thickness of 200 nm, to thereby complete a multilayer insulating layer 34 having a total thickness of 600 nm. Another portion of the SOG layer 34b deposited on the first insulating layer 34a but not on the lower conductor line layer has a thickness of 500 nm. Thereafter, a resist is coated on the third insulating layer 34c, and exposed and developed to form a resist mask (not shown). Utilizing the resist mask, the insulating layers 34c, 34b and 34a are selectively etched by, e.g., an RIE method, to form a contact hole 35 in the multilayer insulating layer 34, which hole exposes a portion of the lower conductor line layer 33. Then, PSG (i.e., an insulator preventing a metal selective vapor-growth) is deposited over the whole surface of the lower conductor layer 33, the side wall of the contact hole 35 and the third PSG insulating layer 34c, by a plasma CVD method, to form an insulating film having a thickness of 50 nm in the same manner as that shown in FIG. 3C. Then, the insulating film is anisotropically etched by an RIE method to expose the surface of the lower conductor layer 33, with the result that a portion of the film lying on the side wall of the contact hole 34 remains as a side wall insulating film 36, in the same manner as shown in FIG. 3D. The side wall insulating film 36 covers the side surface of the multilayer insulating layer 34 including the exposed SOG insulating layer 34b.

Next, as shown in FIG. 5B, tungsten is selectively deposited (grown) within the contact hole 35 with the side wall insulating film 36 by a selective vapor-growth method, to form a tungsten (metal) layer 37 having a thickness sufficient to fill the contact hole completely (e.g., of 600 nm), and thus the contact hole is completely filled with tungsten (metal) selectively grown (with no abnormal portion), to thereby flatten an exposed surface thereof. The selective vapor-growth conditions of the tungsten layer 37 are almost the same as those in Example 1, e.g., as follows:

| Vapor-growing gas: | WF6 gas | 10 sccm |
|---|---|---|
| | SiH4 gas | 5 sccm |
| | H2 gas | 1000 sccm |
| Growth temperature (heated substrate temperature): | 320° | |
| Vacuum pressure: | 0.1 Torr | |

After the flattening, a predetermined (upper) conductor line layer (a second aluminum patterned layer) 38 is formed on the lower conductor line layer 33 and the third (top) PSG insulating layer 34c, by a conventional method, to obtain the desired wiring structure.

In Example 3, it is possible to make the lower (first) conductor line layer of tungsten, titanium, metal silicide, titanium nitride, tantalum, molybdenum, zirconium or gold, in addition to aluminum.

As mentioned above, although a side of an insulating layer activating a metal selective vapor-growth appears at a side wall of a contact hole opened in a multilayer insulating layer, the side is coated with an insulating layer preventing a metal selective vapor-growth, which permits a complete filling of the contact hole with metal deposited (grown) by a selective vapor-growth technique, in accordance with the present invention. Therefore, it is possible to form a wiring of a semiconductor device without defects, such as breakdowns and an increase of a resistance of a conductor line at the contact hole, and to improve the surface flattening process by eliminating a step at the contact hole.

It will be obvious that the present invention is not restricted to the above-mentioned embodiments and that many variations are possible for persons skilled in the art without departing from the scope of the invention.

We claim:

1. A method of forming wiring of a semiconductor device, comprising the following steps (a) to (f):
   (a) forming a multilayer insulating layer (12) comprising at least an insulating layer (12c) activating a metal selective vapor-growth and a top insulating layer (12d) preventing a metal selective-growth on a semiconductor substrate (1);
   (b) forming a contact-hole (13) reaching said semiconductor substrate (1) by selectively etching said multilayer insulating layer (12);
   (c) growing a first metal layer (14) having a thickness such that a surface of the layer (14) is lower than the level of said insulating layer (12c) preventing a metal selective vapor-growth in said contact-hole (13) by a selective vapor-growing method;
   (d) forming an insulator side film (15a) on the side wall of said contact-hole (13) by depositing an insulator film (15) preventing a metal selective vapor-growth over a whole surface of the inside surface of said contact-hole (13) and said top insulating layer (12d) and by anisotropically etching the film (15) to expose the surface of said first metal layer (14);
   (e) filling said contact-hole (13) with a second metal layer (16) by depositing said second metal layer (16) on said first metal layer and within said contact-hole by a selective vapor-growing method; and
   (f) forming a conductor line layer (17) on said second metal layer (16) and said top insulating layer (12d).

2. A method according to claim 1, wherein said insulating layer (12c) activating a metal selective vapor-growth is selected from the group consisting of $SiO_2$, SOG, silicon nitride and polyimide.

3. A method according to claim 1, wherein said top insulating layer (12d) preventing a metal selective-growth is selected from the group consisting of PSG, BSG, BPSG, $SiO_2$ and SiN.

4. A method according to claim 1, wherein said insulator film (15) preventing a metal selective-growth is selected from the group consisting of PSG, BSG, BPSG, $SiO_2$ and SiN.

5. A method according to claim 1, wherein said first metal layer (14) and second metal layer (16) are selected from the group consisting of tungsten, aluminum, copper, tantalum, molybdenum and silicides of these metals, respectively.

6. A method of forming wiring of a semiconductor device, comprising the following steps (g) to (n):
   (g) forming a first insulating layer (12a) on a semiconductor substrate (11);
   (h) forming a first contact-hole by selectively etching said first insulating layer (22a) to expose said semiconductor substrate (21);
   (i) forming a first metal layer (24) to fill said first contact-hole;
   (j) forming a multilayer insulating layer comprising at least an insulating layer (22c) activating a metal selective vapor-growth and a top insulating layer (22d) preventing a metal selective-growth, on said first insulating layer (22a) and first metal layer (24);
   (k) forming a second contact-hole (23) reaching said first metal layer (24) by selectively etching said multilayer insulating layer (22);
   (l) forming an insulator side film (25a) on the side wall of said contact-hole (23) by depositing an insulator film (25) preventing a metal selective vapor-growth over a whole surface of the inside surface of said second contact-hole (23) and said top insulating layer (22d) and by anisotropically etching the film (25) to expose the surface of said first metal layer (24);
   (m) filling said contact-hole (23) with a second metal layer (26) by depositing said second metal layer (26) on said first metal layer and within said second contact-hole by a selective vapor-growing method; and
   (n) forming a conductor line layer (27) on said second metal layer (26) and said top insulating layer (22d).

7. A method according to claim 6, wherein said insulating layer (22c) activating a metal selective vapor-growth is selected from the group consisting of $SiO_2$, SOG, silicon nitride and polyimide.

8. A method according to claim 6, wherein said top insulating layer (22d) preventing a metal selective-growth is selected from the group consisting of PSG, BSG, BPSG, $SiO_2$ and SiN.

9. A method according to claim 6, wherein said insulator film (25) preventing a metal selective-growth is selected from the group consisting of PSG, BSG, BPSG, $SiO_2$ and SiN.

10. A method according to claim 6, wherein said first metal layer (24) and second metal layer (26) are selected from the group consisting of tungsten, aluminum, copper, tantalum, molybdenum and silicide of these metals, respectively.

11. A method of forming wiring of a semiconductor device, comprising the following steps (o) to (s):
    (o) forming a multilayer insulating layer (34) comprising at least an insulating layer (34b) activating a metal selective vapor-growth and a top insulating layer (34c) preventing a metal selective-growth, over a whole exposed surface of an insulating film (32) on a semiconductor substrate (31) and a first conductor line layer (33) which is formed on said insulating film (32);
    (p) forming a contact-hole (35) reaching said first conductor line (33) by selectively etching said multilayer insulating layer (34);
    (q) forming an insulator side film (36) on the side wall of said contact-hole (35) by depositing an insulator film preventing a metal selective vapor-growth over a whole surface of the inside surface of said contact-hole (35) and said top insulating layer (34c) and by anisotropically etching the insulator film to expose the surface of said first conductor line layer (33);
    (r) filling said contact-hole (35) with a metal layer (37) by depositing said metal layer (37) on said first conductor line layer and within said contact-hole by a selective vapor-growing method; and
    (s) forming a second conductor line layer (38) on said metal layer (37) and said top insulating layer (34c).

12. A method according to claim 11, wherein said insulating layer (34b) activating a metal selective vapor-growth is selected from the group consisting of $SiO_2$, SOG, silicon nitride and polyimide.

13. A method according to claim 11, wherein said top insulating layer (34c) preventing a metal selective-growth is selected from the group consisting of PSG, BSG, BPSG, SiO$_2$ and SiN.

14. A method according to claim 11, wherein said insulator film preventing a metal selective-growth is selected from the group consisting of PSG, BSG, BPSG, SiO$_2$ and SiN.

15. A method according to claim 11, wherein said metal layer (37) is selected from the group consisting of tungsten, aluminum, copper, tantalum, molybdenum and silicide of these metals.

16. A method according to claim 11, wherein said first conductor line layer (33) is a conductor selected from the group consisting of aluminum, tungsten, titanium, metal silicide, titanium nitride, tantalum, molybdenum, zirconium and gold.

* * * * *

UNITED STATES PATENT AND TRADEMARK OFFICE
CERTIFICATE OF CORRECTION

PATENT NO. : 5,066,612

DATED : November 19, 1991

INVENTOR(S) : Takayuki OHBA et al.

It is certified that error appears in the above-identified patent and that said Letters Patent is hereby corrected as shown below:

Col 9,     line 8, delete "(a) to (f)";
             line 9, delete "(a)";
             line 14, delete "(b)";
             line 17, delete "(c)";
             line 19, "preventing" should be --activating--;
             line 22, delete "(d)";
             line 30, delete "(e)";
             line 35, delete "(f)";
             line 55, delete "(g) to (n)";
             line 56, delete "(g)";
             line 58, delete "(h)";
             line 61, delete "(i)";
             line 63, delete "(j)".

Col. 10,    line 1, delete "(k)";
             line 4, delete "(l)";
             line 12, delete "(m)";
             line 17, delete "(n)";
             line 37, delete "(o) to (s)";
             line 38, delete "(o)";

UNITED STATES PATENT AND TRADEMARK OFFICE
CERTIFICATE OF CORRECTION

PATENT NO. : 5,066,612

DATED : November 19, 1991

INVENTOR(S) : Takayuki OHBA et al.

It is certified that error appears in the above-identified patent and that said Letters Patent is hereby corrected as shown below:

line 46, delete "(p)";
      line 49, delete "(q)";
      line 57, delete "(r)";
      line 61, delete "(s)".

Signed and Sealed this

Third Day of August, 1993

Attest:

MICHAEL K. KIRK

Attesting Officer      Acting Commissioner of Patents and Trademarks